(12) United States Patent
Wu et al.

(10) Patent No.: US 11,764,721 B2
(45) Date of Patent: Sep. 19, 2023

(54) MOTOR CONTROLLER ELECTRONICS ARRANGEMENTS WITH PASSIVELY COOLED FEEDER CABLES

(71) Applicant: Hamilton Sundstrand Corporation, Charlotte, NC (US)

(72) Inventors: Hailing Wu, Glastonbury, CT (US); Xin Wu, Glastonbury, CT (US); Aritra Sur, South Windsor, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 199 days.

(21) Appl. No.: 17/223,427

(22) Filed: Apr. 6, 2021

(65) Prior Publication Data
US 2021/0320612 A1  Oct. 14, 2021

Related U.S. Application Data

(60) Provisional application No. 63/008,104, filed on Apr. 10, 2020.

(51) Int. Cl.
*H02P 29/68* (2016.01)
*H02P 27/06* (2006.01)
(Continued)

(52) U.S. Cl.
CPC .............. *H02P 29/68* (2016.02); *B60L 50/60* (2019.02); *B64D 27/24* (2013.01); *B64D 31/00* (2013.01);
(Continued)

(58) Field of Classification Search
CPC ...... H02P 29/68; H02P 27/06; B60L 2210/40; B60L 58/27; B60L 50/64; B64D 27/24; B64D 33/08
See application file for complete search history.

(56) References Cited

U.S. PATENT DOCUMENTS 8,345,425 B2   1/2013  Toyoda et al.
9,000,553 B2 * 4/2015  Tokuyama .............. H01L 24/33
                                              257/499
(Continued)

FOREIGN PATENT DOCUMENTS

JP       2004148984 A      5/2004
WO       2019138274 A1     7/2019
WO       WO-2019138274 A1 * 7/2019 ............. H01B 7/428

OTHER PUBLICATIONS

European Search Report Issued in European Application No. 21167832.1-1203 dated Sep. 7, 2021; 8 Pages.

*Primary Examiner* — Thai T Dinh
(74) *Attorney, Agent, or Firm* — CANTOR COLBURN LLP

(57) ABSTRACT

An electronics assembly includes a motor controller electronics arrangement with a solid-state switch array, a feeder cable connected to the motor controller and in electrical communication with the solid-state switch array, and a phase change material body. The phase change material body is thermally coupled to the feeder cable and arranged outside of the motor controller to limit conduction of heat generated by resistive heating of the feeder cable into the motor controller and through the feeder cable. Vehicles, electrical systems, and methods of cooling feeder cables in motor controller electronics arrangements are also described.

18 Claims, 5 Drawing Sheets

(51) Int. Cl.
*B60L 50/64* (2019.01)
*B64D 27/24* (2006.01)
*B60L 50/60* (2019.01)
*B64D 31/00* (2006.01)
*B64D 33/08* (2006.01)
*H02P 29/60* (2016.01)
*B64D 27/02* (2006.01)

(52) U.S. Cl.
CPC .............. *B64D 33/08* (2013.01); *H02P 29/60* (2016.02); *B60L 2200/10* (2013.01); *B64D 2027/026* (2013.01)

(56) References Cited

U.S. PATENT DOCUMENTS

| | | | |
|---|---|---|---|
| 9,007,767 B2 * | 4/2015 | Nakajima | H02M 7/003 |
| | | | 165/80.4 |
| 9,320,180 B2 | 4/2016 | Murphy | |
| 9,701,210 B2 | 7/2017 | Woo et al. | |
| 10,574,150 B2 * | 2/2020 | Yamanaka | H01R 9/2425 |
| 2007/0107962 A1 * | 5/2007 | Steinberg | H05K 7/20927 |
| | | | 180/68.2 |
| 2013/0062724 A1 * | 3/2013 | Tokuyama | H05K 7/1432 |
| | | | 257/734 |
| 2013/0301328 A1 * | 11/2013 | Ito | B60L 3/003 |
| | | | 363/141 |
| 2019/0389310 A1 | 12/2019 | Favaretto | |

\* cited by examiner

MOTOR CONTROLLER ELECTRONICS ARRANGEMENTS WITH PASSIVELY COOLED FEEDER CABLES

CROSS-REFERENCE TO RELATED APPLICATIONS

This application claims the benefit of U.S. Provisional Application No. 63/008,104 filed Apr. 10, 2020, the disclosure of which is incorporated herein by reference in its entirety.

BACKGROUND

The present disclosure is generally related to electrical systems, and more particularly to managing heat in electrical systems.

Vehicles, such as in aircraft, commonly employ motors for various vehicle functions, such as for propulsion. The motors generally receive electrical power through a feeder cable. The feeder cable is generally connected to a power supply, such as a battery and/or a generator, through a motor controller. The motor controller controls the electric motor by controlling the electrical power provided to the motor, typically through varying frequency of alternating current (AC) power communicated to the motor through the feeder cable. As the feeder cable communicates electrical power the current conveying the electrical power resistively heats the feeder cable. In addition to a motor controller, there are other high electrical current applications requiring feeder wire cooling.

Heat generated by resistive heating of the feeder cable increases temperature of the electrical conductor carrying the electric current, as well as the insulation wrapping the conductor. The heat is generally communicated to the ambient air environment through the sheath electrically insulating the electrical conductor. The electrical conductor also conducts heat to the auxiliary circuitries connected to opposite ends of the electrical conductor, including the motor controller. Since the amount of heat conducted to the motor controller corresponds to temperature of the feeder cable, and feeder cable temperature corresponds to both the amount of current carried by the feeder cable and gauge of the electrical conductor, the electrical conductor is generally sized to accommodate the continuous and peak current carried by the feeder cable.

Such systems and methods have generally been acceptable for their intended purpose. However, there remains a need in the art, especially for high power applications, for improved motor controller electronics arrangements, electrical systems, aircraft propulsion architecture, and methods for cooling feeder cables in motor controller electronics arrangements.

BRIEF DESCRIPTION

Disclosed is an electronics assembly including a motor controller electronics arrangement, comprising: a housing enclosing a solid-state switch array; a feeder cable connected to the motor controller and in electrical communication with the solid-state switch array; and a phase change material (PCM) body thermally coupled to the feeder cable and arranged outside of the motor controller to limit conduction of heat generated by resistive heating of the feeder cable into the motor controller and through the feeder cable.

In addition to one or more of the above disclosed aspects of the controller electronics assembly, or as an alternate, the electronics assembly includes a PCM body surrounds the feeder cable.

In addition to one or more of the above disclosed aspects of the controller electronics assembly, or as an alternate, the electronics assembly includes auxiliary circuitries having a temperature rating, and wherein the PCM body includes a PCM having a melting temperature that is below the temperature rating of the auxiliary circuitries.

In addition to one or more of the above disclosed aspects of the controller electronics assembly, or as an alternate, the feeder cable includes a connector coupling the feeder cable to the motor controller.

In addition to one or more of the above disclosed aspects of the controller electronics assembly, or as an alternate, the connector is arranged between the PCM body and the electronics assembly.

In addition to one or more of the above disclosed aspects of the controller electronics assembly, or as an alternate, the PCM body surrounds the connector.

In addition to one or more of the above disclosed aspects of the controller electronics assembly, or as an alternate, the controller electronics assembly includes a container enclosing the PCM body.

In addition to one or more of the above disclosed aspects of the controller electronics assembly, or as an alternate, the feeder cable extends through the container.

In addition to one or more of the above disclosed aspects of the controller electronics assembly, or as an alternate, the electronics assembly includes a connector coupling the feeder cable to the electronics, wherein the connector is arranged within the container.

In addition to one or more of the above disclosed aspects of the controller electronics assembly, or as an alternate, the feeder cable is an A-phase feeder cable and further comprising a B-phase feeder cable connected to the motor controller electronics and in electrical communication with the solid-state switch array.

In addition to one or more of the above disclosed aspects of the motor controller electronics arrangement, or as an alternate, the PCM body is a first PCM body and further comprising a second PCM body, wherein the second PCM body surrounds the B-phase feeder cable and thereby thermally coupled to the B-phase feeder cable.

In addition to one or more of the above disclosed aspects of the controller electronics assembly, or as an alternate, the controller electronics assembly includes a container enclosing the PCM body, wherein both the A-phase feeder cable and the B-phase feeder cable extend through the container and are thermally coupled to the PCM body within the container.

In addition to one or more of the above disclosed aspects of the controller electronics assembly, or as an alternate, the controller electronics assembly includes a controller operably connected to the solid-state switch array, wherein the controller has an electric mode wherein the feeder cable resistively heats to a temperature greater than or equal to a melting temperature of the PCM body.

Further disclosed is a vehicle, including an electric motor, wherein the electric motor is an alternating current power electric motor; and a motor controller electronics arrangement as disclosed above, wherein the feeder cable electrically connects the solid-state switch array to the electric motor.

In addition to one or more of the above disclosed aspects of the vehicle, or as an alternate, the vehicle includes a direct current (DC) power source including a battery electrically connected to the solid-state switch array.

In addition to one or more of the above disclosed aspects of the vehicle, or as an alternate, the vehicle includes a gas turbine engine operably associated with the electric motor; and a propulsor including a propeller or a fan operably associated with the gas turbine engine.

Disclosed is an electrical system, including a motor controller electronics arrangement as disclosed above, wherein the PCM body surrounds the feeder cable; and wherein the motor controller includes auxiliary circuitries having a temperature rating, and wherein the PCM body includes a PCM having a melting temperature that is below the temperature rating of the auxiliary circuitries.

In addition to one or more of the above disclosed aspects of the electrical system, or as an alternate, the feeder cable includes a connector coupling the feeder cable to the motor controller, and further comprising a container enclosing the PCM body.

In addition to one or more of the above disclosed aspects of the electrical system, or as an alternate, the electrical system includes a container enclosing the PCM body, wherein the feeder cable is an A-phase feeder cable and further comprising a B-phase feeder cable connected to the motor controller and in electrical communication with the solid-state switch array.

Disclosed is a method of cooling a feeder cable, comprising: at a motor controller electronics arrangement including a motor controller with a solid-state switch array, a feeder cable connected to the motor controller electronics and in electrical communication with the solid-state switch array, and a phase change material (PCM) body thermally coupled to the feeder cable and arranged outside of the motor controller, converting direct current (DC) power into alternating current (AC) power with the solid-state switch array; communicating the AC power from the solid-state switch array to an electric motor through the feeder cable; heating the feeder cable with the AC power communicated to the electric motor through the feeder cable; transferring heat from the feeder cable and the PCM body; and limiting conduction of heat into the motor controller electronics from the feeder cable and generated by resistive heating of the feeder cable with the AC power.

Technical effects of the present disclosure include the capability to cool feeder cables near the connection of the feeder cable to the motor controller electronics. In certain examples the present disclosure provides the capability to limit temperature at the connection as power flow through the feeder cable increases. In accordance with certain examples the present disclosure provides the capability to limit heat flow from the feeder cables towards the connector. It is also contemplated that communication of heat from the feeder cable to the motor controller electronics be limited passively, e.g., without a coolant flow and/or consuming electrical power.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
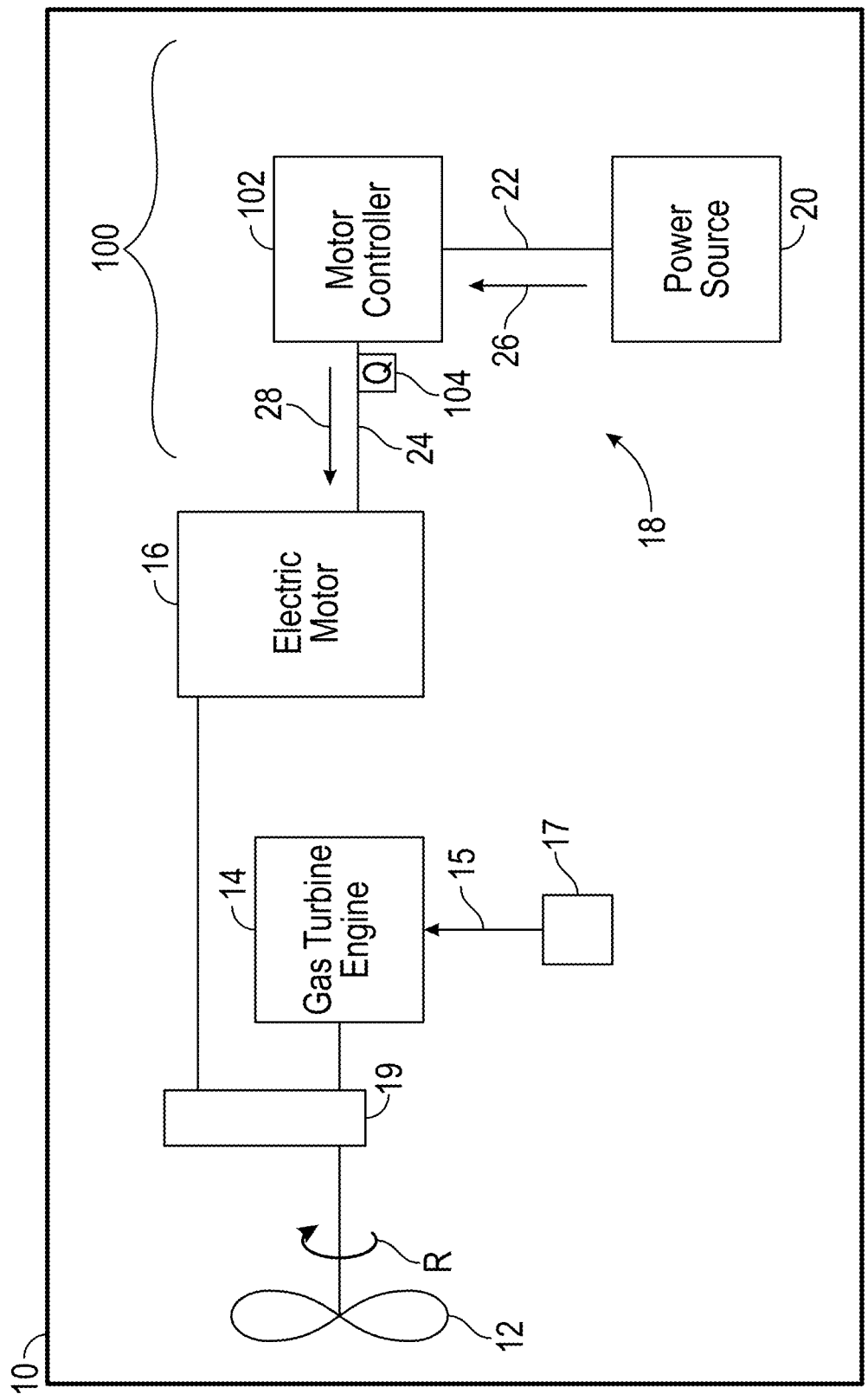
FIG. 1 is a schematic view of an electrical system constructed in accordance with the present disclosure, showing a motor controller electronics arrangement with a phase change material (PCM) body connected to a feeder cable.

Reference will now be made to the drawings wherein like reference numerals identify similar structural features or aspects of the subject disclosure. For purposes of explanation and illustration, and not limitation, a partial view of an example of a motor controller electronics arrangement constructed in accordance with the disclosure is shown in FIG. 1 and is designated generally by reference character 100. Other examples of motor controller electronics arrangements, electrical systems, and methods of cooling feeder cables in motor controller electronics arrangements are provided in FIGS. 2-4, as will be described. The systems and methods described herein can be used for powering electric motors in vehicles, such as in hybrid electric aircraft, though the present disclosure is not limited to hybrid electric aircraft or to any particular type of vehicle in general.

With reference to FIG. 1, a vehicle 10, e.g., a hybrid electric aircraft, is shown. The vehicle 10 includes a propulsor 12, a gas turbine engine 14 that receives fuel 15, e.g., from an aircraft fuel tank 17, and an electric motor 16. The gas turbine engine 14 and electric motor 16 may be connected in parallel to the propulsor 12 by a gearbox 19. The vehicle 10 also includes an electrical system 18 (otherwise referred to as an electronics assembly).

The propulsor 12 is operably associated with the gas turbine engine 14, e.g., via a shaft and/or a gearbox. The electric motor 16 is operably connected to the gas turbine engine 14 and is electrically connected to the electrical system 18. In certain examples the propulsor 12 includes a propeller or a fan. In accordance with certain examples the electric motor 16 is an alternating current (AC) power electric motor, such as a three (3) phase AC electric motor.

The electrical system 18 includes a power source 20, a source bus 22, a motor controller 102, and a feed bus 24. The power source 20 is connected to the source bus 22, the source bus 22 connects the power source 22 to the motor controller 102, and the feed bus 24 connects the motor controller 102 to the electric motor 16. In certain examples the power source 20 include a direct current (DC) power source, such as a DC generator and/or a battery. In accordance with certain examples the power source 20 includes an alternating current (AC) power source, such as an AC generator. It is contemplated that the electric motor 16 be an alternating current (AC) motor, such as a three (3) phase electric motor.

The motor controller 102 is arranged to convert the source power 26 provided by the power source 20 via the source bus 22 into a flow of feed power 28. The feed power 28 is communicated by the motor controller 102 to the electric motor 16 via the feed bus 24 and is adapted for control of the electric motor 16, e.g., via controlling the frequency of the feed power 28. The feed power 28 causes the electric motor 16 to rotate R the propulsor 12. In certain examples the gas turbine engine 14 and the electric motor 16 are arranged to cooperatively rotate the propulsor 12 during certain operating regimes, e.g., during takeoff and climbing of an aircraft, allowing the gas turbine engine 14 to be undersized in relation to the peak horsepower requirement of the vehicle 10.

As will be appreciated by those of skill in the art in view of the present disclosure, flowing the feed power 28 through the feed bus 24 resistively heats the feed bus 24, increasing temperature of the feed bus 24. Since increasing the temperature of the feed bus 24 increases temperature of electrical components of the motor controller 102 via conduction, the feed bus 24 should be sized to limit the amount of heat conducted into the motor controller 102. To limit the size of the feed bus 24 (and thereby thermal conduction) the motor controller electronics arrangement 100 includes a phase change material (PCM) body 104. The PCM body 104 is thermally coupled to the feed bus 24 and is arranged to limit communication of the heat Q into the motor controller 102 from the feed bus 24.

Figure 2:
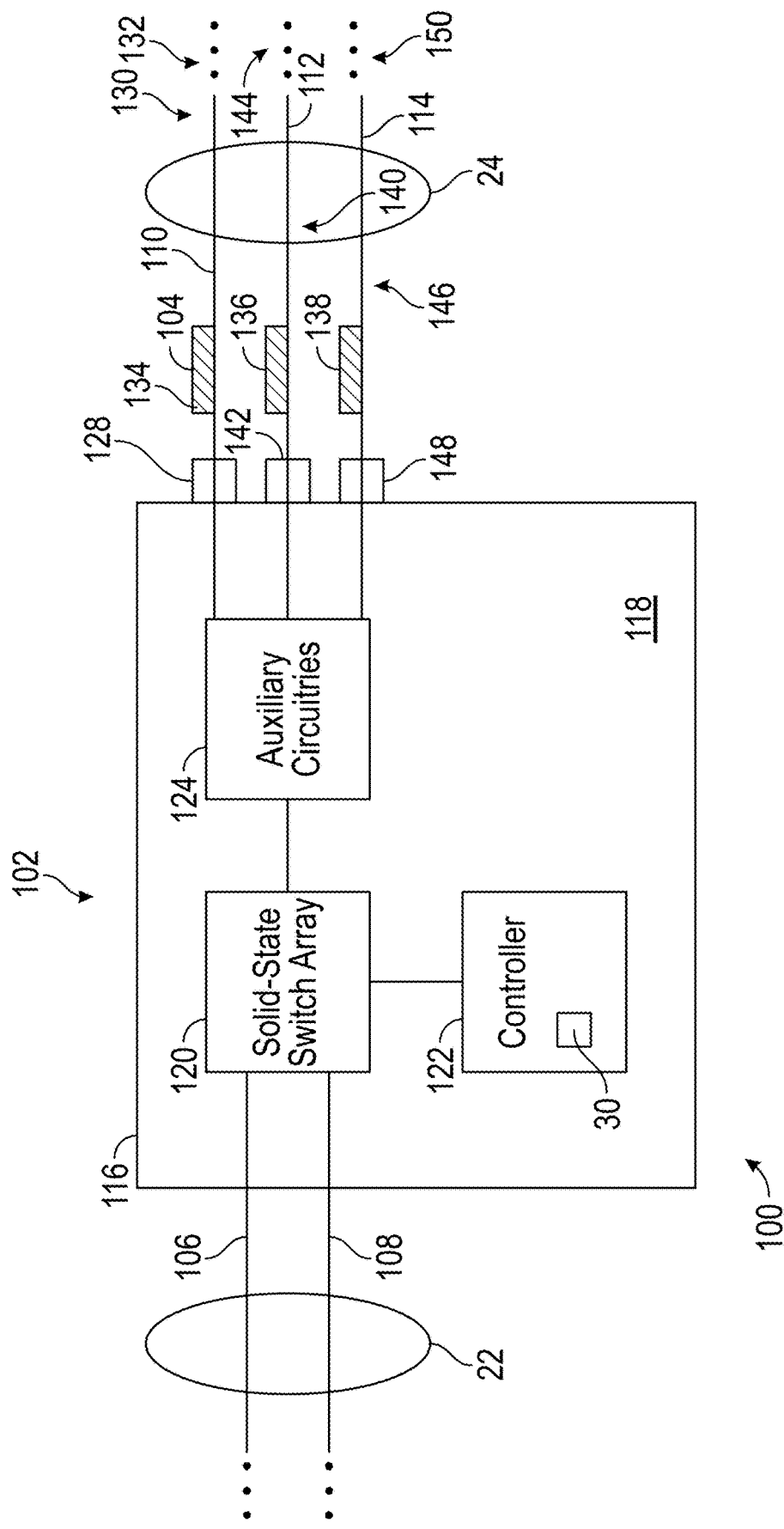
FIG. 2 is a schematic view of the electrical system of FIG. 1 according to an example, showing the PCM body surrounding an individual feeder cable near the connection to the motor controller.

With reference to FIG. 2, a motor controller electronics arrangement 100 including the motor controller 102 and the PCM body 104 is shown according to an example. The motor controller electronics arrangement 100 includes the motor controller 102, the PCM body 104, the source bus 22, and the feed bus 24. The source bus 22 includes a DC source cable 106 and a DC return cable 108. As shown in FIG. 2 the feed bus 24 is a three-phase bus including an A-phase feeder cable 110 (corresponding to a first phase of the three phase (AC)), a B-phase feeder cable 112 (corresponding to a second phase of the three phase (AC)), and C-phase feeder cable 114 (corresponding to a third phase of the three phase (AC)). As used herein a cable may be another form of conductor including a bus.

The motor controller 102 includes a housing 116 with an interior 118, a solid-state switch array 120, a controller 122, and auxiliary circuitries 124. The source bus 22, e.g., the DC source cable 106 and the DC return cable 108, is electrically connected to the solid-state switch array 120 and electrically couple the power source 20 (shown in FIG. 1) to the solid-state switch array 120. The solid-state switch array 120 is connected to the feed bus 24, e.g., to the A-phase feeder cable 110, the B-phase feeder cable 112, and the C-phase feeder cable 114, and therethrough to the electric motor 16 (shown in FIG. 1). The auxiliary circuitries 124 are electrically connected between the solid-state switch array 120 and the feed bus 24 and has a temperature rating 126.

The controller 122 is operably connected to the solid-state switch array 120 and has an electric mode 30. In the electric mode 30 the controller causes the solid-state switch array 120 to convert the source power 26 (shown in FIG. 1) into the feed power 28 (shown in FIG. 1), e.g., for operating the propulsor 12 (shown in FIG. 1) during certain operating regimes of the vehicle 10 (shown in FIG. 1). In certain examples the solid-state switch array 120 inverts DC current provided by the source bus 22 into AC current for communication to the electric motor 16 (shown in FIG. 1) when in the electric mode 30. It is contemplated that, when in the electric mode 30, the solid-state switch array 120 apply AC current to the feed bus 24 with frequency corresponding to a desired rotational speed of the propulsor 12 (shown in FIG. 1) and/or the gas turbine engine 14 (shown in FIG. 1).

The A-phase feeder cable 110 includes an A-phase feeder cable connector 128, an A-phase feeder cable motor controller portion 130, and an A-phase feeder cable electric motor portion 132. The A-phase feeder cable connector 128 connects the A-phase feeder cable motor controller portion 130 to the motor controller 102, the A-phase feeder cable motor controller portion 130 connects the A-phase feeder cable electric motor portion 132 to the A-phase feeder cable motor controller portion 130, and the electric motor 16 (shown in FIG. 1) is connected to the A-phase feeder cable electric motor portion 132.

The PCM body 104 is arranged to absorb the heat Q (shown in FIG. 1) when the motor controller 102 communicates the source power 24 (shown in FIG. 1) to the electric motor 16 (shown in FIG. 1) while in the electric mode 30, and to dissipate the heat when the electric motor 16 is idle. In this respect the PCM body 104 includes a PCM 134, is thermally coupled to the A-phase feeder cable 110, and surrounds the A-phase feeder cable motor controller portion 130 to limit (or eliminate entirely) communication of heat generated resistively when conveying the feed power 28 (shown in FIG. 1) to the electric motor 16 (shown in FIG. 1). Specifically, the PCM body 104 provides passive cooling of the A-phase feeder cable 110 by absorbing heat when the feed power 28 flows through the A-phase feeder cable 110. When the vehicle 10 (shown in FIG. 1) is in the electric mode 30 the A-phase feeder cable 110 becomes hot and the PCM body 104 melts, absorbing thermal energy in the form of latent heat at a relatively constant temperature and limiting communication of heat to the A-phase feeder cable connector 128. It is contemplated that the PCM 134 have a melting temperature that is below the temperature rating 126 of the auxiliary circuitries 124.

As shown in FIG. 2 the PCM body 104 is a first PCM body 104 and the motor controller electronics arrangement 100 includes a second PCM body 136 and a third PCM body 138. The second PCM body 136 is similar to the first PCM body 104 and is additionally thermally coupled to the B-phase feeder cable 112, surrounds a B-phase feeder cable motor controller portion 140, and is located between (and spaced apart from) both a B-phase feeder cable connector 142 and a B-phase feeder cable electric motor portion 144. The third PCM body 138 is also similar to the first PCM body 104 and is additionally thermally coupled to the C-phase feeder cable 114, surrounds a C-phase feeder cable motor controller portion 146, and is located between (and spaced apart from) both a C-phase feeder cable connector 148 and a C-phase feeder cable electric motor portion 150. Although shown and described herein as a three-phase feed bus, it is to be understood and appreciated that the feed bus 24 can be a two-phase feed bus or have four (4) or more phases and remain within the scope of the present disclosure.

Figure 3:
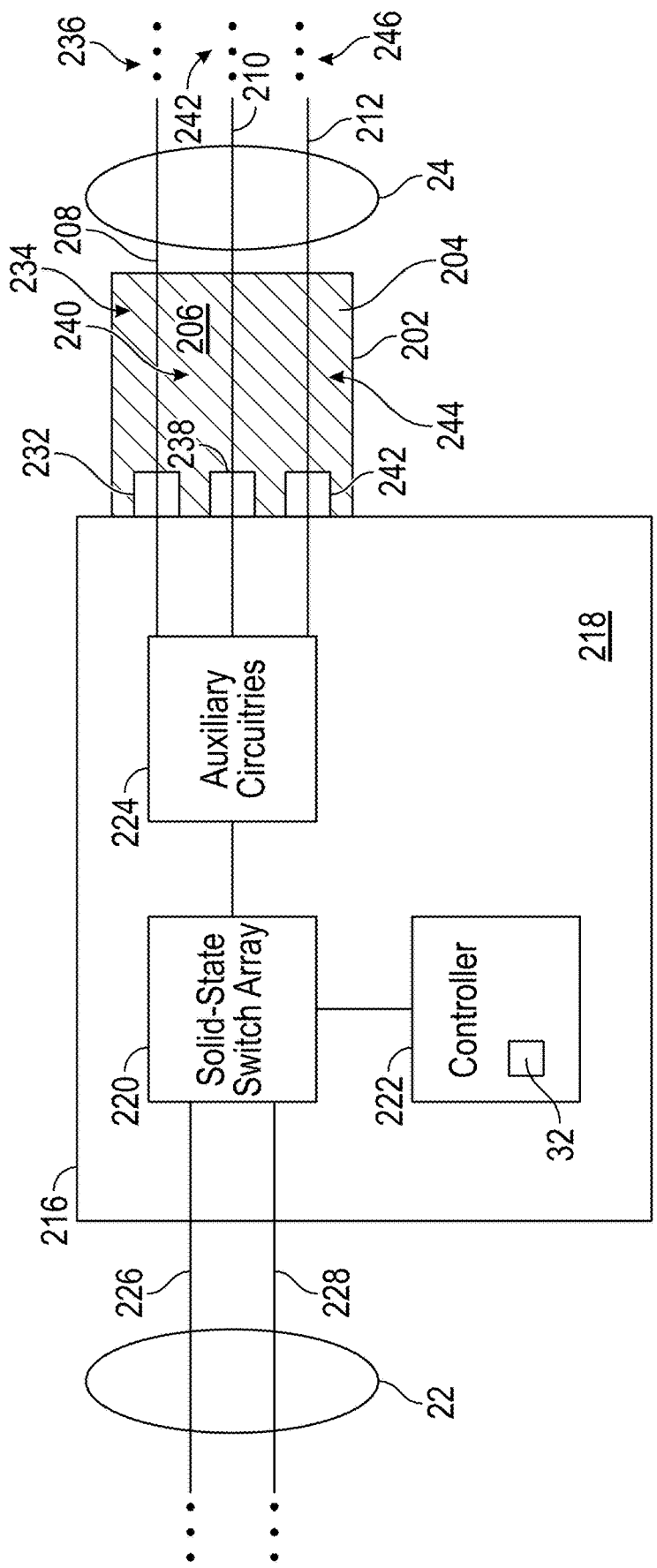
FIG. 3 is a schematic view of the electrical system of FIG. 1 according to another example, showing a container enclosing the feeder cable and a connector coupling the feeder cable to the motor controller.

With reference to FIG. 3, a motor controller electronics arrangement 200 is shown. The motor controller electronics arrangement 200 is similar to the motor controller electronics arrangement 100 (shown in FIG. 1) and additionally includes a container 202 and a PCM body 204. The PCM body 204 is arranged within an interior 206 of the container 202. It is contemplated that the PCM body 204 include the phase change material 134 (shown in FIG. 2) for removing heat Q (shown in FIG. 1) from the feed bus 24. In certain examples the PCM 134 includes a paraffin, such as a 32-carbon or a 33-carbon paraffin. In accordance with certain examples the PCM 134 includes hydrated salts, paraffin wax, or non-paraffin organics.

In illustrated example the feed bus 24 is a three-phase AC feed bus including an A-phase feeder cable 208 (corresponding to a first phase of the three phase (AC)), a B-phase feeder cable 210 (corresponding to a second phase of the three phase (AC)), and a C-phase feeder cable 212 (corresponding to a third phase of the three phase (AC)). The motor controller 214 includes a housing 216 with an interior 218, solid-state switch array 220, a controller 222, and auxiliary circuitries 224. The source bus 22, e.g., a DC source cable 226 and the DC return cable 228, are electrically connected to the solid-state switch array 220 and electrically couple the power source 20 (shown in FIG. 1) to the solid-state switch array 220. The solid-state switch array 220 is connected to the feed bus 24, e.g., to the A-phase feeder cable 208, the B-phase feeder cable 210, and the C-phase feeder cable 212, and therethrough to the electric motor 16 (shown in FIG. 1). The auxiliary circuitries 224 are electrically connected between the solid-state switch array 220 and the feed bus 24 and has a temperature rating 230.

The controller 222 is operably connected to the solid-state switch array 220 and has an electric mode 32. In the electric mode 32 the controller 222 causes the solid-state switch array 220 to convert the source power 26 (shown in FIG. 1) into the feed power 28 (shown in FIG. 1). In certain examples the solid-state switch array 220 inverts DC current provided by the source bus 22 into AC current for communication to the electric motor 16 (shown in FIG. 1) when in the electric mode 32. It is contemplated that, when in the electric mode 32, the solid-state switch array 220 apply AC current to the feed bus 24 with frequency corresponding to a desired rotational speed of the propulsor 12 (shown in FIG. 1) and/or the gas turbine engine 14 (shown in FIG. 1).

The A-phase feeder cable 208 includes an A-phase feeder cable connector 232, an A-phase feeder cable motor controller portion 234, and an A-phase feeder cable electric motor portion 236. The A-phase feeder cable connector 232 connects the A-phase feeder cable motor controller portion 234 to the motor controller 214, the A-phase feeder cable motor controller portion 234 connects the A-phase feeder cable electric motor portion 236 to the A-phase feeder cable connector 232, and the electric motor 16 (shown in FIG. 1) is connected to the A-phase feeder cable motor controller portion 234 by the A-phase feeder cable electric motor portion 236. It contemplated that the A-phase feeder cable connector 232 and the A-phase feeder cable motor controller portion 234 extend through the container 202, are surrounded by the PCM body 204, and are thermally coupled therein to the PCM body 204 for communication of the heat Q (shown in FIG. 1) to the PCM body 204.

In the illustrated example the PCM body 204 is a singular PCM body 204. Each of the A-phase feeder cable 208, the B-phase feeder cable 210, and the C-phase feeder cable 212 the C-phase feeder cable 212 extend through the container 202 and are thermally coupled to the PCM body 204. In this respect the B-phase feeder cable 210 includes a B-phase feeder cable connector 238, a B-phase feeder cable motor controller portion 240, and a B-phase feeder cable electric motor portion 242; that the C-phase feeder cable 212 include a C-phase feeder cable connector 244, a C-phase feeder cable motor controller portion 246, and a C-phase feeder cable electric motor portion 248; and that each of the B-phase feeder cable connector 238, the B-phase feeder cable motor controller portion 240, the C-phase feeder cable connector 242, and the C-phase feeder cable motor controller portion 244 be arranged within the container 202. As will be appreciated by those of skill in the art in view of the present disclosure, this allows the PCM body 204 to cool both the feeder cable motor controller portion and the connectors of the A-phase feeder cable 208, the B-phase feeder cable 210, and the C-phase feeder cable 212 when the motor controller electronics arrangement 200 is in the electric motor mode 32.

Figure 4:
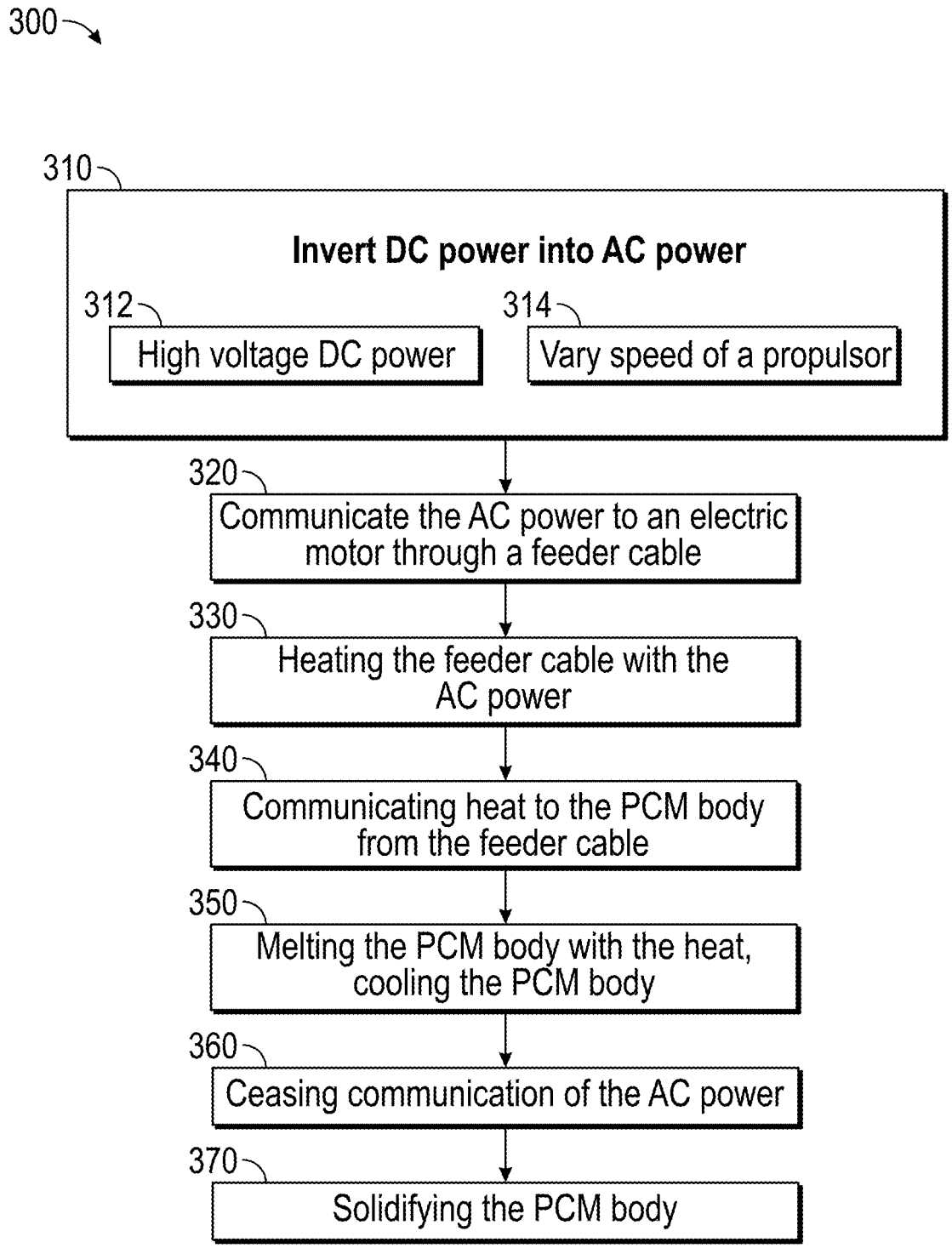
FIG. 4 is a block diagram of a feeder cable cooling method, showing operations of the method according to an illustrative and non-limiting example of the method.

With reference to FIG. 4, a method 300 of cooling a feeder cable in a motor controller electronics arrangement, e.g., the A-phase feeder cable 110 (shown in FIG. 2) in the motor controller electronics arrangement 100 (shown in FIG. 1), is shown. As shown with box 310, the method 300 includes inverting DC power into AC power with a solid-state switch array, e.g., the source power 26 (shown in FIG. 1) into the feed power 28 (shown in FIG. 1) using the solid-state switch array 120 (shown in FIG. 2). In certain examples DC power is high voltage DC power, such as 270-volt, 540-volt or even higher-volt DC power, as shown with box 312. In accordance with certain examples the AC power is variable frequency AC having a frequency selected vary rotational speed of a propulsor, as shown with box 314, such as to operate the motor controller in an electric mode, e.g., the electric mode 30 (shown in FIG. 2).

Figure 5:
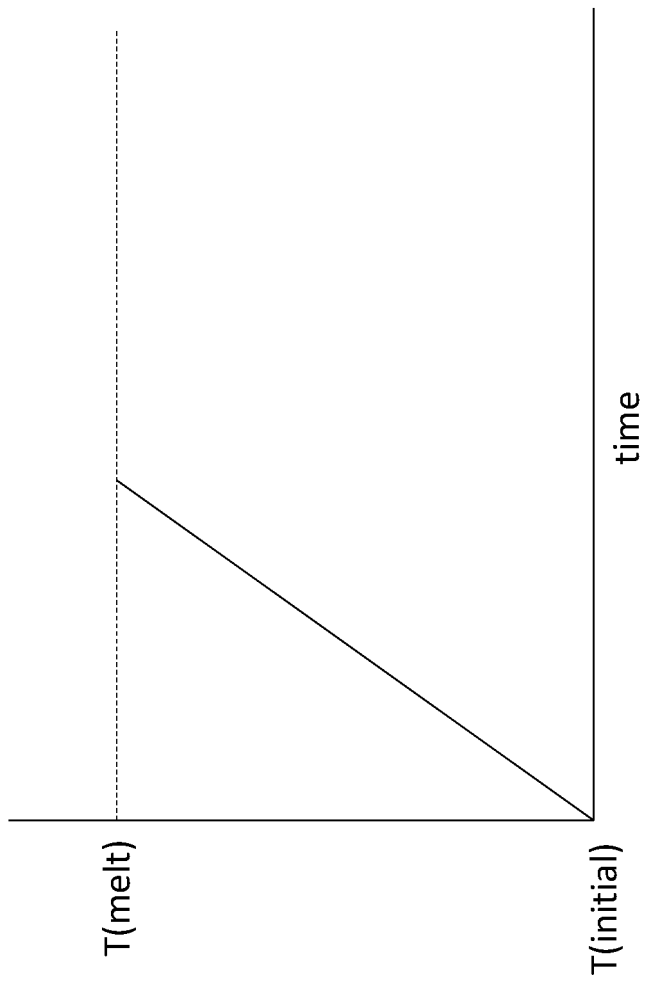
FIG. 5 is a graph illustrating resistive heating the feeder cable from a current temperature to a melting temperature of the PCM body, from the application of current (Q) through the feeder cable.

As shown with box 320, the AC power is communicated from the solid-state switch array to an electrical motor using a feeder cable, e.g., to the electric motor 16 (shown in FIG. 1) through the feeder cable 110 (shown in FIG. 2). As shown with box 330, the AC power flowing through the feeder cable heats the feeder cable due to resistive heating of the feeder cable by the electric current conveying the AC power. It is contemplated that heat be communicated from the feeder cable to a PCM body thermally coupled to the feeder cable, e.g., to the PCM body 134 (shown in FIG. 2), as shown with box 340, that the heat melt the PCM body, as shown with box 350. FIG. 5 is a graph illustrating resistive heating the feeder cable (e.g., 110) over time, from an initial or current temperature (T(initial)) to a melting temperature (T(melt)) of the PCM body (e.g., 104), due to the application of current (Q) through the feeder cable. The illustrated graph shape is schematic only and not intended on prescribing a specific heating curve. The melting of the PCM body limits conduction of heat into the motor controller through the feeder cable. It is also contemplated that, once power is removed from the feeder cable, the PCM body solidify, as shown with box 360 and box 370.

Vehicles, such as aircraft, commonly employ electric motors. Some electric motors are controlled by varying frequency of AC power communicated to the electric, typically using a solid-state switch array arranged within a motor controller and electrically connected to the electric motor by a feeder cable. As the electrical current flows through the feeder cable the electric current resistively heats the feeder cable. The heat is typically dissipated to the ambient environment through the feeder cable sheath and through conduction to the motor controller through the connector coupling the feeder cable to the motor controller. While generally acceptable for its intended purpose conduction of heat through the connector can limit the amount of current carried by the feeder cable and/or require that the cable be larger than otherwise required by the peak current flow.

In examples described herein a PCM body is thermally coupled to the feeder cable to limit conduction of heat into the motor controller, passively cooling the feeder cable. As the feeder cable communicates AC power heat from resistive heating of the feeder cable melts the PCM body, limiting temperature of the connector coupling the feeder cable to the motor controller. In certain examples the PCM body is thermally coupled (e.g., directly connected) to a single feeder cable. In accordance with certain examples the PCM body is thermally coupled (e.g. directly connected) to more than one feeder cable. It is also contemplated that the PCM body can be thermally coupled (e.g., directly connected) to the connectors coupling the feeder cables to the motor controller.

Technical effects of the present disclosure include the capability to provide passive cooling of the feeder cable and/or the connector cyclically by melting and freezing the PCM body. Conveying power to the electric motor heats the feeder cable, melts the PCM body, and heat is absorbed in the form of latent heat at a relatively constant temperature corresponding to the melting temperature of the PCM body. When power is removed from the electric motor the feeder cable cools, the PCM body freezes, and the energy stored by melting the PCM body released. Advantageously, the PCM body enables managing the heat at a relatively constant temperature, limiting heat flow from the feeder cable toward the connector and into motor controller without employing a coolant flow or consuming electrical power.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronics assembly, comprising:
   a motor controller electronics arrangement with a solid-state switch array;
   a feeder cable connected to the motor controller electronics arrangement and in electrical communication with the solid-state switch array;
   a phase change material (PCM) body thermally coupled to the feeder cable and arranged outside of the motor controller electronics arrangement to limit conduction of heat generated by resistive heating of the feeder cable into the motor controller electronics arrangement and through the feeder cable; and
   a controller operably connected to the solid-state switch array, wherein the controller has an electric mode, wherein the feeder cable resistively heats to a temperature greater than or equal to a melting temperature of the PCM body.

2. The electronics assembly of claim 1, wherein the PCM body surrounds the feeder cable.

3. The electronics assembly of claim 1, wherein the feeder cable includes a connector coupling the feeder cable to the motor controller electronics arrangement.

4. The electronics assembly of claim 3, wherein the connector is arranged between the PCM body and the motor controller electronics arrangement.

5. The electronics assembly of claim 3, wherein the PCM body surrounds the connector.

6. The electronics assembly of claim 1, further comprising a container enclosing the PCM body.

7. The electronics assembly of claim 6, wherein the feeder cable extends through the container.

8. The electronics assembly of claim 6, further comprising a connector coupling the feeder cable to the motor controller electronics arrangement, wherein the connector is arranged within the container.

9. The electronics assembly of claim 1, wherein the feeder cable is an A-phase feeder cable and further comprising a B-phase feeder cable connected to the motor controller electronics arrangement and in electrical communication with the solid-state switch array.

10. The electronics assembly of claim 9, wherein the PCM body is a first PCM body and further comprising a second PCM body, wherein the second PCM body surrounds the B-phase feeder cable and thereby thermally coupled to the B-phase feeder cable.

11. The electronics assembly of claim 9, further comprising a container enclosing the PCM body, wherein both the A-phase feeder cable and the B-phase feeder cable extend through the container and are thermally coupled to the PCM body within the container.

12. A vehicle, comprising:
    an electric motor, wherein the electric motor is an alternating current power electric motor; and
    a electronics assembly as recited in claim 1, wherein the feeder cable electrically connects the solid-state switch array to the electric motor.

13. The vehicle of claim 12, further comprising a direct current (DC) power source including a battery electrically connected to the solid-state switch array.

14. The vehicle of claim 12, further comprising:
    a gas turbine engine operably associated with the electric motor; and
    a propulsor including a propeller or a fan operably associated with the gas turbine engine.

15. An electrical system, comprising:
    a electronics assembly as recited in claim 1, wherein the PCM body surrounds the feeder cable; and
    wherein the motor controller electronics arrangement includes auxiliary circuitries having a temperature rating, and wherein the PCM body includes a PCM having a melting temperature that is below the temperature rating of the auxiliary circuitries.

16. The electrical system of claim 15, wherein the feeder cable includes a connector coupling the feeder cable to the motor controller electronics arrangement, and further comprising a container enclosing the PCM body.

17. The electrical system of claim 15, further comprising a container enclosing the PCM body, wherein the feeder cable is an A-phase feeder cable and further comprising a B-phase feeder cable connected to the motor controller electronics arrangement and in electrical communication with the solid-state switch array.

18. A method of cooling a feeder cable, comprising:

at an electronics assembly including a motor controller electronics arrangement with a solid-state switch array, a feeder cable connected to the motor controller electronics arrangement and in electrical communication with the solid-state switch array, and a phase change material (PCM) body thermally coupled to the feeder cable and arranged outside of the motor controller electronics arrangement, converting direct current (DC) power into alternating current (AC) power with the solid-state switch array;

communicating the AC power from the solid-state switch array to an electric motor through the feeder cable;

heating the feeder cable with the AC power communicated to the electric motor through the feeder cable;

transferring heat from the feeder cable and the PCM body; and limiting conduction of heat into the motor controller electronics arrangement from the feeder cable and generated by resistive heating of the feeder cable with the AC power, wherein the assembly includes a controller operably connected to the solid-state switch array, wherein the controller has an electric mode wherein the feeder cable resistively heats to a temperature greater than or equal to a melting temperature of the PCM body.

\* \* \* \* \*